US010543607B2

(12) United States Patent
Takechi et al.

(10) Patent No.: US 10,543,607 B2
(45) Date of Patent: Jan. 28, 2020

(54) HANDHELD PERSONAL CARE DEVICE

(71) Applicant: Panasonic Intellectual Property Management Co., Ltd., Osaka (JP)

(72) Inventors: Mitsuru Takechi, Shiga (JP); Shinji Nishimura, Shiga (JP); Takafumi Ohba, Shiga (JP); Atsushi Takahashi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/896,345

(22) Filed: Feb. 14, 2018

(65) Prior Publication Data

US 2018/0243929 A1    Aug. 30, 2018

(30) Foreign Application Priority Data

Feb. 24, 2017   (JP) .................................. 2017-033893

(51) Int. Cl.
*B26B 19/38*   (2006.01)
*H03K 17/96*   (2006.01)
(Continued)

(52) U.S. Cl.
CPC ......... *B26B 19/388* (2013.01); *H03K 17/955* (2013.01); *H03K 17/96* (2013.01); *B26B 19/14* (2013.01); *B26B 19/3886* (2013.01)

(58) Field of Classification Search
CPC ... B26B 19/388; B26B 19/14; B26B 19/3886; H03K 17/96; H03K 17/955; A45D 1/00;
(Continued)

(56) References Cited

U.S. PATENT DOCUMENTS 5,453,644 A   9/1995 Yap et al.
6,188,837 B1  2/2001 Kwan
(Continued)

FOREIGN PATENT DOCUMENTS

EP    172020 A2    2/1986
JP    5-235733 A   9/1993
(Continued)

OTHER PUBLICATIONS

The Extended European Search Report dated Jun. 25, 2018 for the related European Patent Application No. 18156240.6.

*Primary Examiner* — Ghassem Alie
(74) *Attorney, Agent, or Firm* — McDermott Will & Emery LLP

(57) ABSTRACT

A handheld personal care device according to the present disclosure includes: an operation switch configured to change a treatment operation of an operation unit; a sensor electrode configured to cause a change in capacitance depending on whether or not the grip unit is grasped; and a control device electrically connected to the operation switch and the sensor electrode and configured to control the treatment operation of the operation unit. The control device includes: a grasp detector configured to detect that the grip unit is grasped based on a change in capacitance of the sensor electrode; and a change permission part configured to permit the operation switch to change the treatment operation of the operation unit when the change permission part receives, from the grasp detector, grasp information indicating that the grip unit is grasped.

7 Claims, 9 Drawing Sheets

(51) Int. Cl.
H03K 17/955 (2006.01)
B26B 19/14 (2006.01)

(58) Field of Classification Search
CPC .. A45D 6/00; A45D 26/0023; A45D 2200/00; A45D 2/00; A45D 20/12; A45D 26/00; A45D 26/0076
USPC ........ 30/34.05, 537, 43.6, 32, 41.7, 43.1, 43
See application file for complete search history.

(56) References Cited

U.S. PATENT DOCUMENTS

| | | | | |
|---|---|---|---|---|
| 6,393,718 | B1 * | 5/2002 | Harris | A45D 20/12 |
| | | | | 34/96 |
| 6,612,034 | B2 * | 9/2003 | Damstra | B25F 5/00 |
| | | | | 173/176 |
| 7,100,283 | B1 * | 9/2006 | Grdodian | B26B 21/4056 |
| | | | | 30/34.05 |
| 2003/0202851 | A1 * | 10/2003 | Kovarik | B25F 5/00 |
| | | | | 408/8 |
| 2003/0216817 | A1 * | 11/2003 | Pudney | E05B 81/78 |
| | | | | 700/17 |
| 2004/0040948 | A1 * | 3/2004 | Mandell | A45D 20/12 |
| | | | | 219/222 |
| 2007/0091627 | A1 * | 4/2007 | Nitawaki | B60R 25/246 |
| | | | | 362/501 |
| 2014/0123414 | A1 | 5/2014 | Okazaki | |
| 2014/0277951 | A1 * | 9/2014 | Kim | B60R 16/0231 |
| | | | | 701/48 |
| 2015/0205279 | A1 * | 7/2015 | Simeth | A45D 27/22 |
| | | | | 307/31 |
| 2016/0307712 | A1 | 10/2016 | Nishimura et al. | |
| 2018/0188883 | A1 * | 7/2018 | Bytheway | A63F 13/218 |

FOREIGN PATENT DOCUMENTS

| | | |
|---|---|---|
| JP | 2005-312530 A | 11/2005 |
| JP | 2013-034636 A | 2/2013 |
| JP | 2016-202235 A | 12/2016 |
| WO | 1982/003520 A1 | 10/1982 |
| WO | 2010/066966 A1 | 6/2010 |

* cited by examiner

HANDHELD PERSONAL CARE DEVICE

RELATED APPLICATIONS

This application claims the benefit of priority to Japanese Application No. 2017-033893, filed on Feb. 24, 2017, the disclosure of which is incorporated by reference herein in its entirety.

BACKGROUND

1. Technical Field

The present disclosure relates to a handheld personal care device configured to perform treatment on body hair and/or skin while being grasped by a human hand, such as an electric razor, a hair clipper, a facial treatment device, and a hair dryer.

2. Description of the Related Art

When a handheld personal care device such as an electric razor is carried in a bag, there is a risk that an operation switch thereof is unintentionally pressed in the bag and the handheld personal care device operates unexpectedly. Accordingly, a measure is needed to avoid an unintentional push of the operation switch.

To avoid an erroneous operation that a handheld personal care device operates unintentionally, an operation switch may be equipped with a structural member such as a lock mechanism. For example, Unexamined Japanese Patent Publication No. 2005-312530 discloses a handheld personal care device in which an operation switch is supported by two kinds of springs having different elasticity to avoid an erroneous operation of the operation switch.

Unexamined Japanese Patent Publication No. 2016-202235 discloses a handheld personal care device that is configured to shift the modes depending on the length of time in which the operation switch is continuously pressed and is configured to lock the operation switch by a long-pressing of the operation switch.

SUMMARY

However, in the case where an operation switch is equipped with such a lock mechanism, a user is required to perform a lock operation or an unlock operation, which leads to complexity of operation and has a problem in which a user may forget to perform a lock operation. In the case where the modes are shifted depending on the length of time in which the operation switch is continuously pressed, there remains a risk that a locked state of the operation switch is released by an unintentional long pressing of the operation switch. The present disclosure is derived from the above problems, and provides a handheld personal care device that can avoid an erroneous operation without complexity of the operation.

A handheld personal care device according to one aspect of the present disclosure includes a grip unit to be grasped by a hand and an operation unit configured to treat a human body, and the handheld personal care device includes: an operation switch configured to change a treatment operation of the operation unit; a sensor electrode that is embedded in the grip unit, and causes a change in capacitance depending on whether or not the grip unit is grasped; and a control device electrically connected to the operation switch and the sensor electrode, and configured to control the treatment operation of the operation unit. The control device includes a grasp detector configured to detect that the grip unit is grasped based on a change in capacitance of the sensor electrode; and a change permission part configured to permit the operation switch to change the treatment operation of the operation unit when the change permission part receives, from the grasp detector, grasp information indicating that the grip unit is grasped.

According to the handheld personal care device of the present disclosure, an erroneous operation of the operation switch can be prevented without complexity of the operation, and the operation switch can be locked without forgetting.

Figure 1:
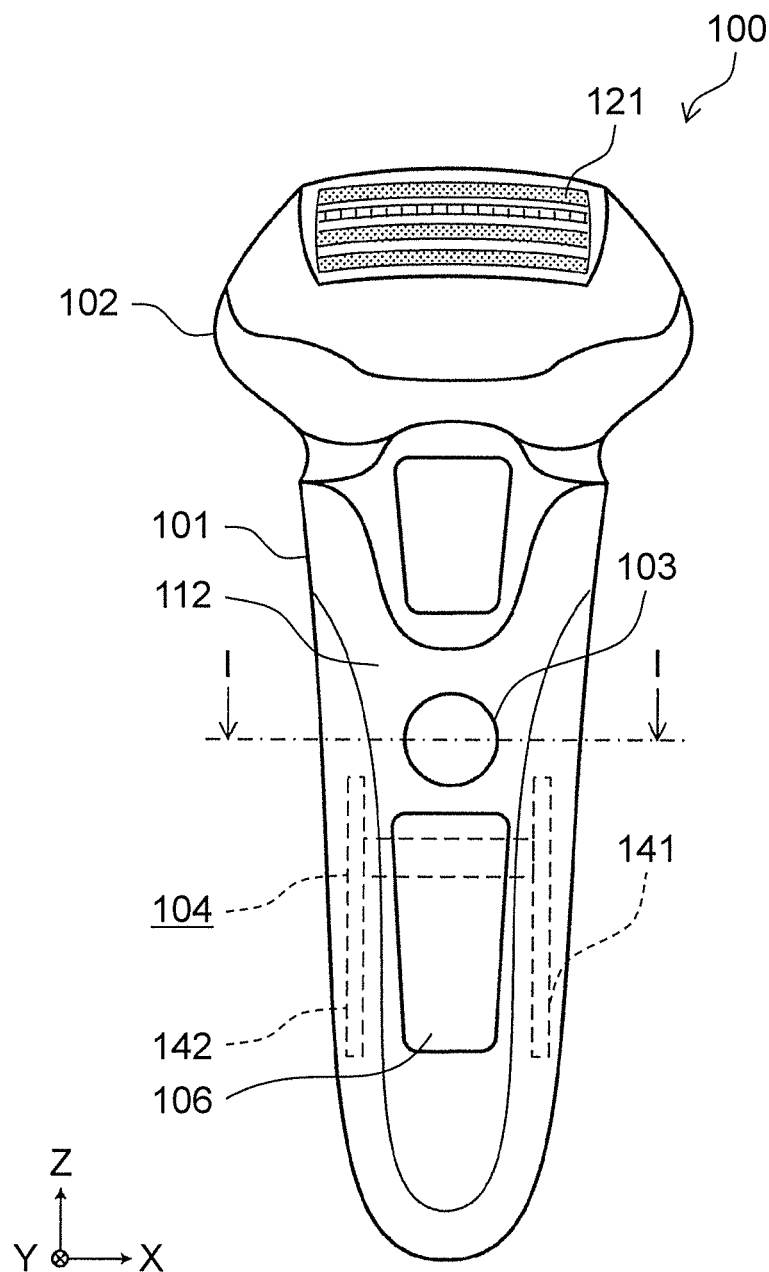
FIG. 1 is a front view of a handheld personal care device according to a first exemplary embodiment.

DETAILED DESCRIPTION (An Example of a Possible Exemplary Embodiment of a Handheld Personal Care Device)

A handheld personal care device according to one aspect of the present disclosure includes a grip unit to be grasped by a hand and an operation unit configured to treat a human body, and the handheld personal care device includes: an operation switch configured to change a treatment operation of the operation unit; a sensor electrode that is embedded in the grip unit, and causes a change in capacitance depending on whether or not the grip unit is grasped; and a control device electrically connected to the operation switch and the sensor electrode, and configured to control the treatment operation of the operation unit. The control device includes a grasp detector configured to detect that the grip unit is grasped based on a change in capacitance of the sensor electrode; and a change permission part configured to permit the operation switch to change the treatment operation of the operation unit when the change permission part receives, from the grasp detector, grasp information indicating that the grip unit is grasped.

This prevents an erroneous operation of the handheld personal care device, such as an unintentional start of the treatment operation caused by contact between the operation switch and a foreign object when the handheld personal care device is carried in a bag. Unlike a mechanism in which an operation switch is mechanically locked or unlocked, it is not necessary for a user to perform a lock operation of the operation switch, and thus complexity of the lock operation can be avoided and also a situation in which the operation switch is left unlocked does not occur.

The term "lock" used herein denotes a state in which the operation switch is not permitted to change the treatment operation of the operation unit, and does not denote only a state in which the operation switch is mechanically inoperable. The term "unlock" used herein refers to a state opposite to the state denoted by the term "lock", and denotes that the operation switch is permitted to change the treatment operation of the operation unit.

The change permission part may be configured to permit the operation switch to change the treatment operation of the operation unit during a first predetermined time period after receiving the grasp information.

With this configuration, the operation switch is locked again after the first predetermined time period, even in the case where the operation switch is temporarily unlocked due to a change in capacitance caused by a situation in which the handheld personal care device gets wet by water or the like. Accordingly, the operation switch can be reliably locked even when the handheld personal care device is put on a place exposed to water such as a washroom or a bathroom. Thus, occurrence of an erroneous operation is suppressed.

The change permission part may permit the operation switch to change the treatment operation of the operation unit during a second predetermined time period after an operation of the operation unit is stopped.

This configuration improves convenience by eliminating the need of an unlock operation of the operation switch such as re-grasping of the grip unit when the treatment operation is to be restarted after the treatment operation of the handheld personal care device is suspended for a while to check a treatment state after a treatment to a human body such as shaving.

The change permission part may permit the operation switch to change the treatment operation of the operation unit when the operation switch is continuously operated, for example, continuously pressed through a third predetermined time period.

With this configuration, the operation switch can be forcibly unlocked, thereby enabling a change of the treatment operation of the handheld personal care device even in a situation where abnormality occurs in, for example, the grasp detector and the operation switch cannot be released from a locked state.

The operation switch may be provided on a first surface of the grip unit, and the sensor electrode may include a first electrode and a second electrode each of which has a plate-shape. The first electrode and the second electrode may be disposed to meet the first surface, and disposed to sandwich the operation switch.

With this configuration, the first electrode and the second electrode are disposed near a part that is strongly grasped at the time of operating the operation switch while grasping the grip unit, which enables the grasp detector to detect a change in capacitance of the sensor electrode. Accordingly, a threshold value to determine whether or not being grasped can be set to be high, thereby enabling suppressing erroneous detection of the grasp detector by excluding a detection of a change in capacitance of the sensor electrode caused by an event other than grasping.

The handheld personal care device may further include a watertight housing inside the grip unit. The sensor electrode may be accommodated in the watertight housing.

This configuration prevents the sensor electrode from directly contacting water or the like, and protects the sensor electrode from rust and stain, which leads to a stable detection of a change in capacitance.

First Exemplary Embodiment

Exemplary embodiments of a handheld personal care device according to the present disclosure are described below with reference to the drawings. Note that the following exemplary embodiments simply show examples of the handheld personal care device according to the present disclosure. Therefore, the scope of the present disclosure is defined by the wording of the claims with reference to the following exemplary embodiments, and the present disclosure is not limited only to the following exemplary embodiments. Thus, among the structural elements in the exemplary embodiments below, the structural elements not recited in the independent claim representing the superordinate concept of the present disclosure are not necessarily needed to achieve the problems of the present disclosure, but are described as a more preferable embodiment.

The drawings are schematic illustrations in which emphasis, omission, and adjustment in proportion are made as appropriate to illustrate the present disclosure, and may differ from the actual apparatus in its shape, positional relationship, and proportion.

Figure 2:
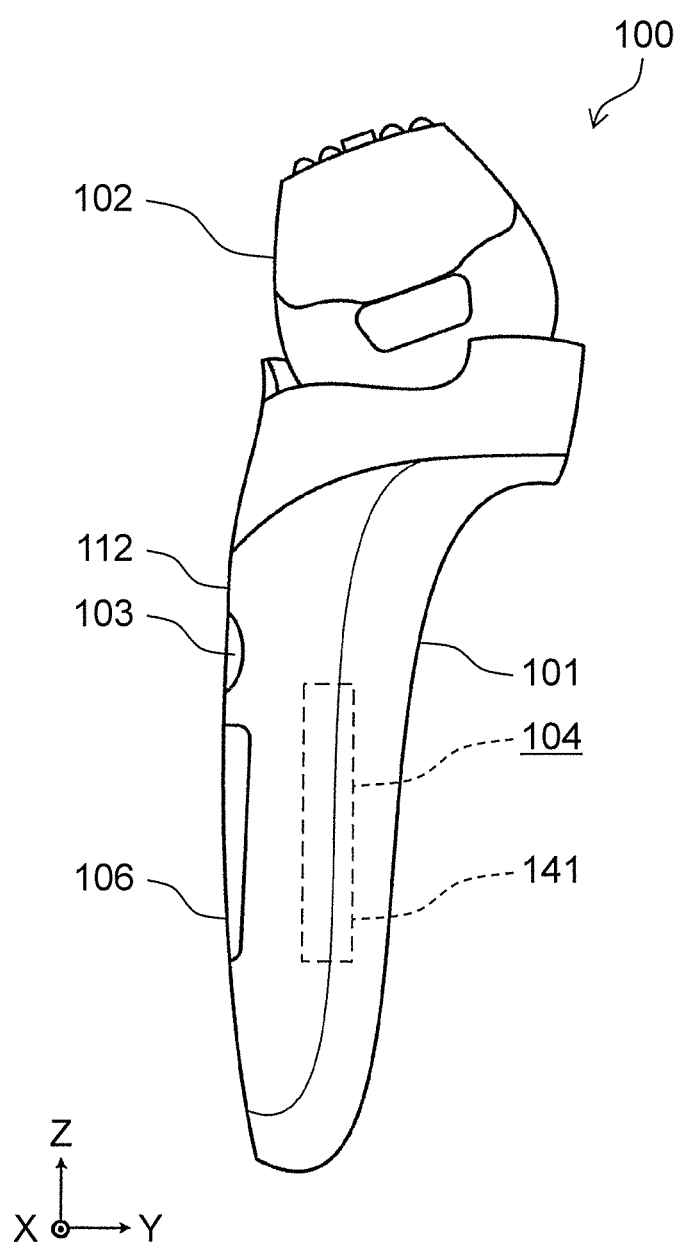
FIG. 2 is a side view of the handheld personal care device according to the first exemplary embodiment.
Figure 3:
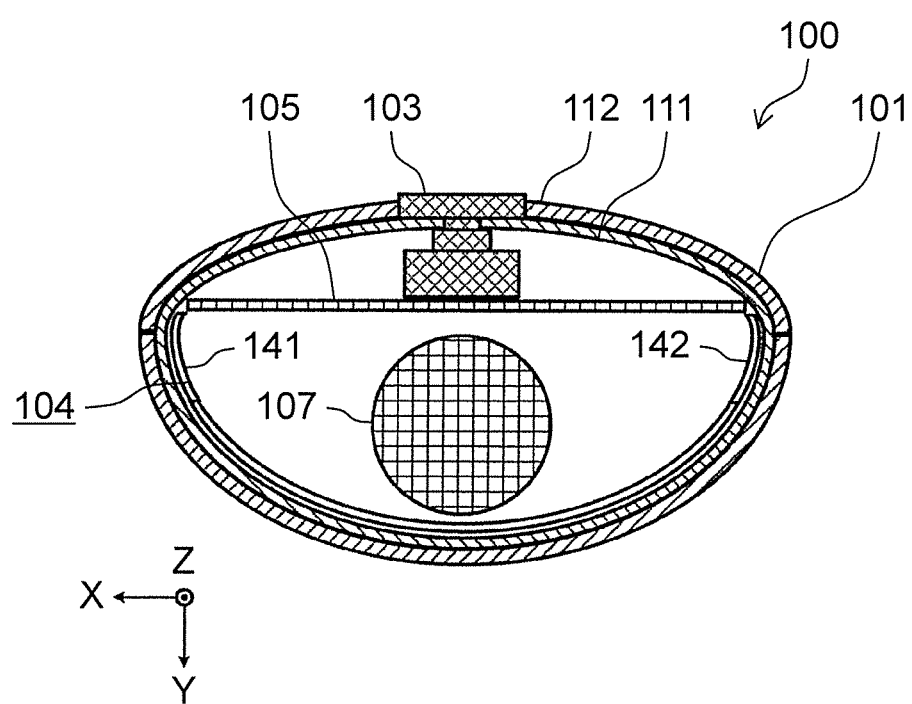
FIG. 3 is a sectional view taken along line I-I in FIG. 1 according to the first exemplary embodiment.

FIG. 1 is a front view of a handheld personal care device.
FIG. 2 is a side view of the handheld personal care device.
FIG. 3 is a sectional view taken along line I-I in FIG. 1.

Referring to FIGS. 1 to 3, handheld personal care device 100 according to the present exemplary embodiment is an electric razor configured to treat body hair such as a mustache and the like, and includes grip unit 101 to be grasped by a human hand, and operation unit 102 configured to perform a treatment operation such as shaving the mustache and the like of a human body. Handheld personal care device 100 includes operation switch 103, sensor electrode 104, and control device 105. According to the present exemplary embodiment, handheld personal care device 100 further includes display device 106 and power source 107.

Grip unit 101 is a part to be grasped when using handheld personal care device 100 against a human body, and has an outer shape to be easily held with one hand. Grip unit 101 has a space therein, so that control device 105 and power source 107, such as a dry battery, a secondary battery, or an AC-DC converter, can be accommodated.

According to the present exemplary embodiment, watertight housing 111 is provided inside grip unit 101 to form a watertight compartment to accommodate control device 105 and power source 107. This configuration prevents adhesion of water to control device 105 and power source 107 even when water or the like is splashed onto grip unit 101, which enables handheld personal care device 100 to be used in a bathroom, for example.

Operation unit 102 is a part that performs a treatment operation against a human body and applies hairdressing and beauty treatment. According to the present exemplary embodiment, handheld personal care device 100 is an electric razor, and thus operation unit 102 includes outer blade unit 121, and an inner blade unit (not shown) disposed inside outer blade unit 121 and configured to move relative to outer blade unit 121 so as to cut body hair inserted from outer blade unit 121. Operation unit 102 is provided to rotate (swing) around grip unit 101.

Operation unit 102 includes not only a member configured to operate mechanically, such as a blade, but also a member configured to operate electrically that apply a voltage to a human body, a member configured to operate magnetically that exerts a magnetic force on a human body, and the like.

Operation switch 103 is an electrical component configured to change a treatment operation of operation unit 102. According to the present exemplary embodiment, operation switch 103 is a push-button switch, and contacts of operation switch 103 are closed while operation switch 103 is pressed.

There is no limitation on operation switch 103. Operation switch 103 may be any mechanical switch such as a push-button switch and a slide switch, or may be electrically achieved by using a touch sensor or the like.

Sensor electrode 104 is an electrical component that is embedded in grip unit 101 and is configured to cause a change in capacitance depending on whether or not grip unit 101 is grasped by a human hand. According to the present exemplary embodiment, sensor electrode 104 includes first electrode 141 and second electrode 142 each of which is a plate-shaped metal member disposed to meet first surface 112 of grip unit 101 to which operation switch 103 is attached.

First electrode 141 and second electrode 142 are disposed to face each other with operation switch 103 being sandwiched therebetween, and are disposed on a side wall of grip unit 101. First electrode 141 and second electrode 142 included in sensor electrode 104 are accommodated in watertight housing 111, and are disposed in contact with or near an inner surface of watertight housing 111. First electrode 141 and second electrode 142 extend in a longitudinal direction of grip unit 101 from operation switch 103 toward a side opposite to operation unit 102.

Including such first electrode 141 and second electrode 142, sensor electrode 104 allows a human hand grasping an outside of grip unit 101 to quickly change the capacitance regardless of being disposed inside watertight housing 111. The capacitance of sensor electrode 104 can be changed largely, since a finger pad and/or a palm comes closest to sensor electrode 104 and a wide area of a finger pad and/or a palm comes close to sensor electrode 104, when grip unit 101 is grasped to operate operation switch 103 with the thumb or when grip unit 101 is grasped by one hand to operate operation switch 103 with the index finger of the other hand. Since sensor electrode 104 is disposed in the watertight compartment, sensor electrode 104 can be prevented from contacting with water, thereby preventing occurrence of rust and stain.

Control device 105 is a processing device that is electrically connected to operation switch 103 and sensor electrode 104 and is configured to control operation unit 102. Control device 105 is a device incorporating a so-called microcomputer, various interfaces, various drivers, and the like, and capable of outputting desired information (signals) by processing information (signals) input by hardware or by hardware and software.

Figure 4:
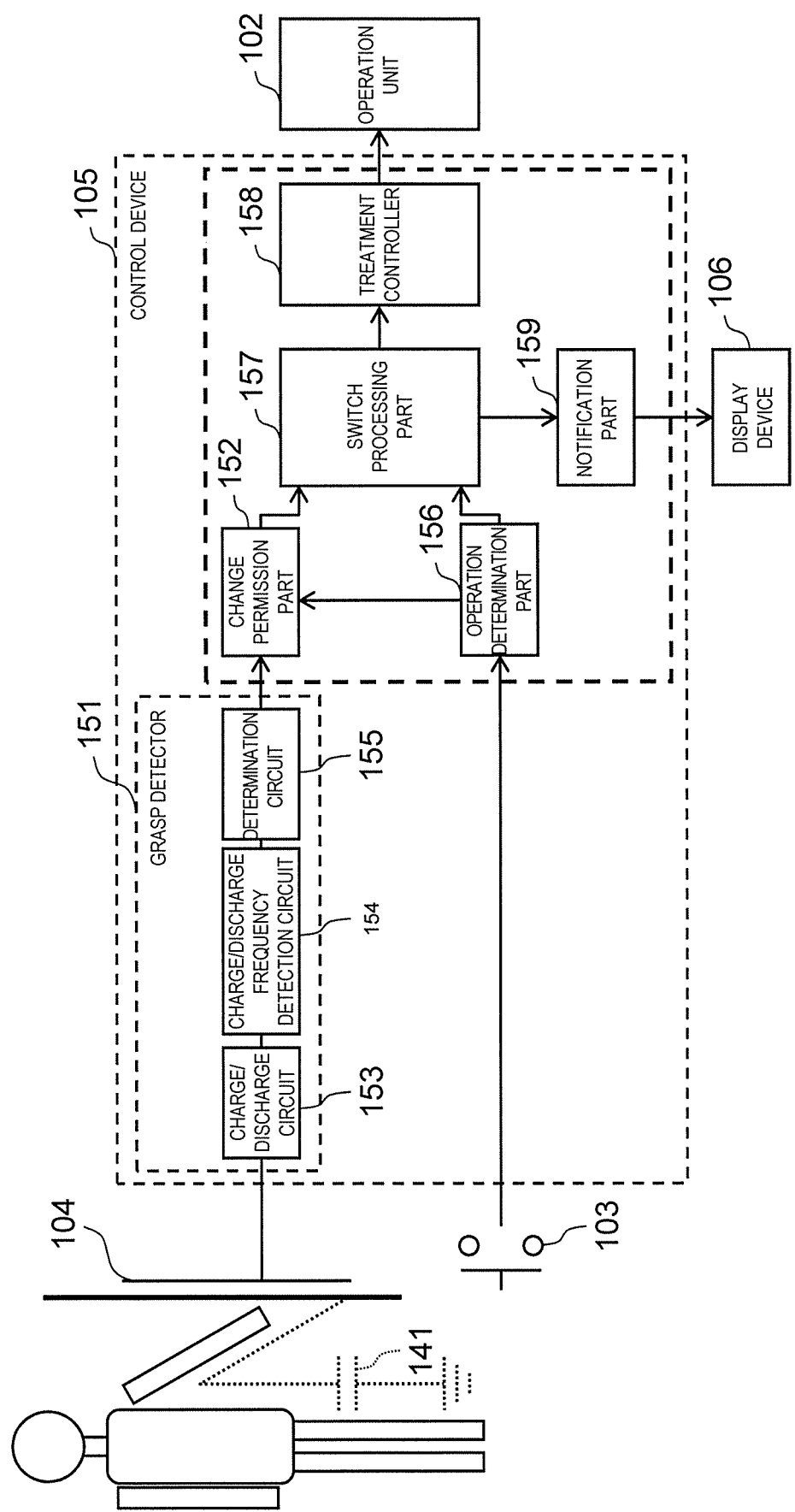
FIG. 4 is a block diagram showing functional parts of a control device together with mechanism parts according to the first exemplary embodiment.

FIG. 4 is a block diagram showing functional parts of a control device together with mechanism parts.

As shown in FIG. 4, control device 105 includes grasp detector 151 and change permission part 152. According to the present exemplary embodiment, control device 105 includes operation determination part 156, switch processing part 157, treatment controller 158, and notification part 159.

Grasp detector 151 is a processing part configured to detect that grip unit 101 is grasped by a user based on a change in capacitance of sensor electrode 104. According to the present exemplary embodiment, grasp detector 151 is a chip component formed of circuits including semiconductor elements such as charge/discharge circuit 153, charge/discharge frequency detection circuit 154, and determination circuit 155.

An example of a detection principle of grasp detector 151 is described below. Capacitance of sensor electrode 104 (shown by a capacitor illustrated by broken lines in FIG. 4), in other words, an amount of electric charge that can be stored in sensor electrode 104 changes depending on whether grip unit 101 is grasped or not. Specifically, capacitance becomes large when grip unit 101 is grasped, and becomes relatively smaller when grip unit 101 is not grasped than when grip unit 101 is grasped. Accordingly, whether or not grip unit 101 is grasped by a human body can be determined by detecting a relative change in capacitance of sensor electrode 104.

According to the present exemplary embodiment, a relative change in capacitance of sensor electrode 104 is detected based on charge/discharge frequency during a fourth predetermined time period.

Figure 5:
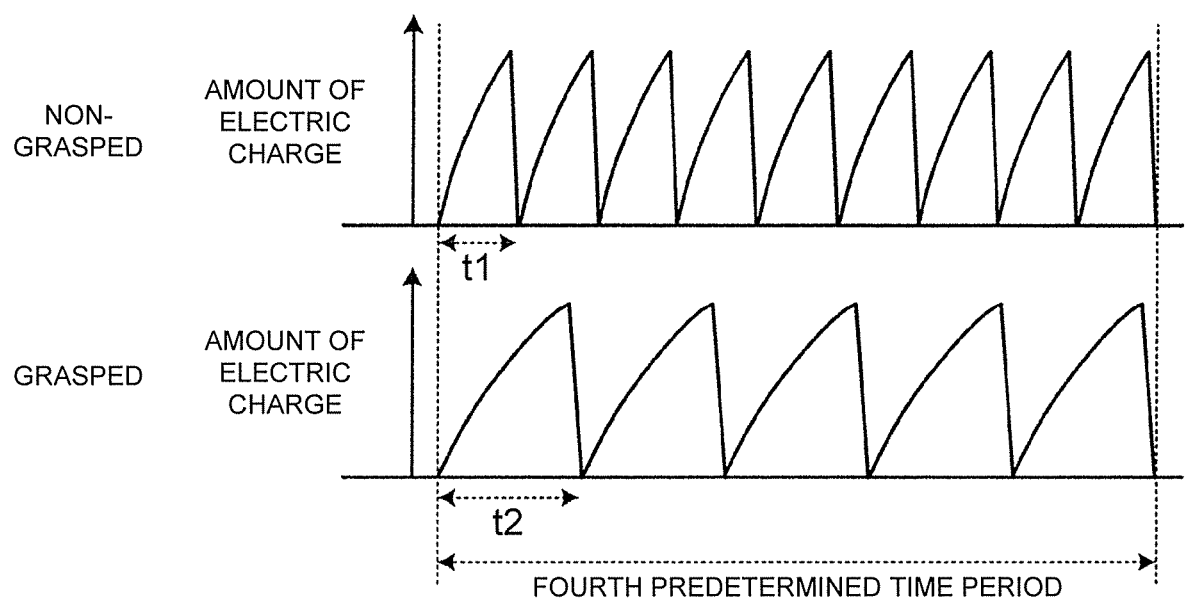
FIG. 5 illustrates a difference in charge/discharge frequency caused by a difference in capacitance of a sensor electrode according to the first exemplary embodiment.

FIG. 5 illustrates a difference in the charge/discharge frequency caused by a difference in capacitance of a sensor electrode.

Referring to FIG. 5, t1 is a time period in which charge/discharge circuit 153 charges and discharges sensor electrode 104 with a predetermined amount of electric charge when grip unit 101 is not grasped and capacitance of sensor electrode 104 is small ("NON-GRASPED" in FIG. 5). Whereas, t2 (t2>t1) is a time period in which charge/discharge circuit 153 charges and discharges sensor electrode 104 with the same amount of electric charge when grip unit 101 is grasped and capacitance of sensor electrode 104 becomes relatively large ("GRASPED" in FIG. 5). Accordingly, counting charge/discharge frequency in the fourth predetermined time period enables determination whether capacitance becomes large or small.

Specifically, charge/discharge frequency detection circuit 154 counts charge/discharge frequency during the fourth predetermined time period, and determination circuit 155 outputs grasp information indicating that grip unit 101 is grasped, when an amount of change in the charge/discharge frequency obtained by charge/discharge frequency detection circuit 154 exceeds a threshold value as compared to a preceding state.

Change permission part 152 is a processing part that permits operation switch 103 to change a treatment operation of operation unit 102, when change permission part 152 receives the grasp information indicating that grip unit 101 is grasped from grasp detector 151. According to the present exemplary embodiment, change permission part 152 is a processing part that is achieved by allowing a computing device (central processing unit (CPU), for example) included in control device 105 to execute a program.

According to the present exemplary embodiment, change permission part 152 outputs to switch processing part 157 change information indicating permission or non-permission for change based on the grasp information from grasp detector 151.

Then, a processing flow of handheld personal care device 100 is described below.

Figure 6:
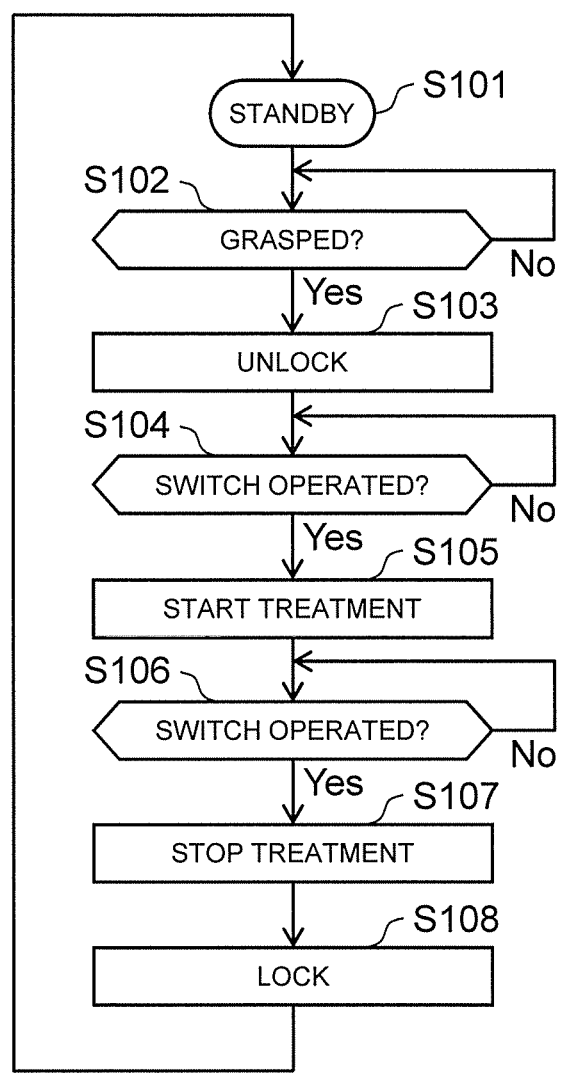
FIG. 6 is a flow chart showing a processing flow of the control device including a grasp detector and a change permission part according to the first exemplary embodiment.
Figure 7:
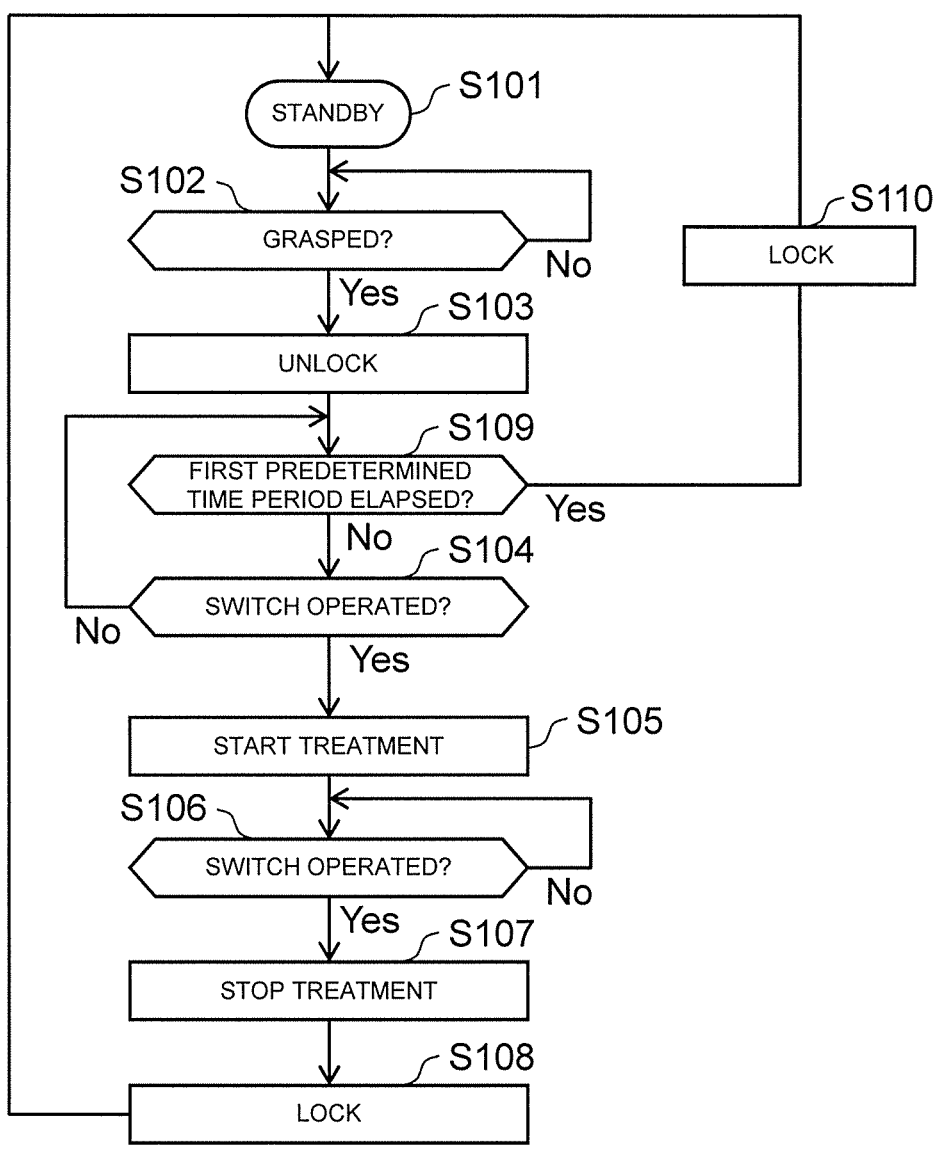
FIG. 7 is a flow chart showing a processing flow of a control device including a grasp detector and a change permission part according to a second exemplary embodiment.
Figure 8:
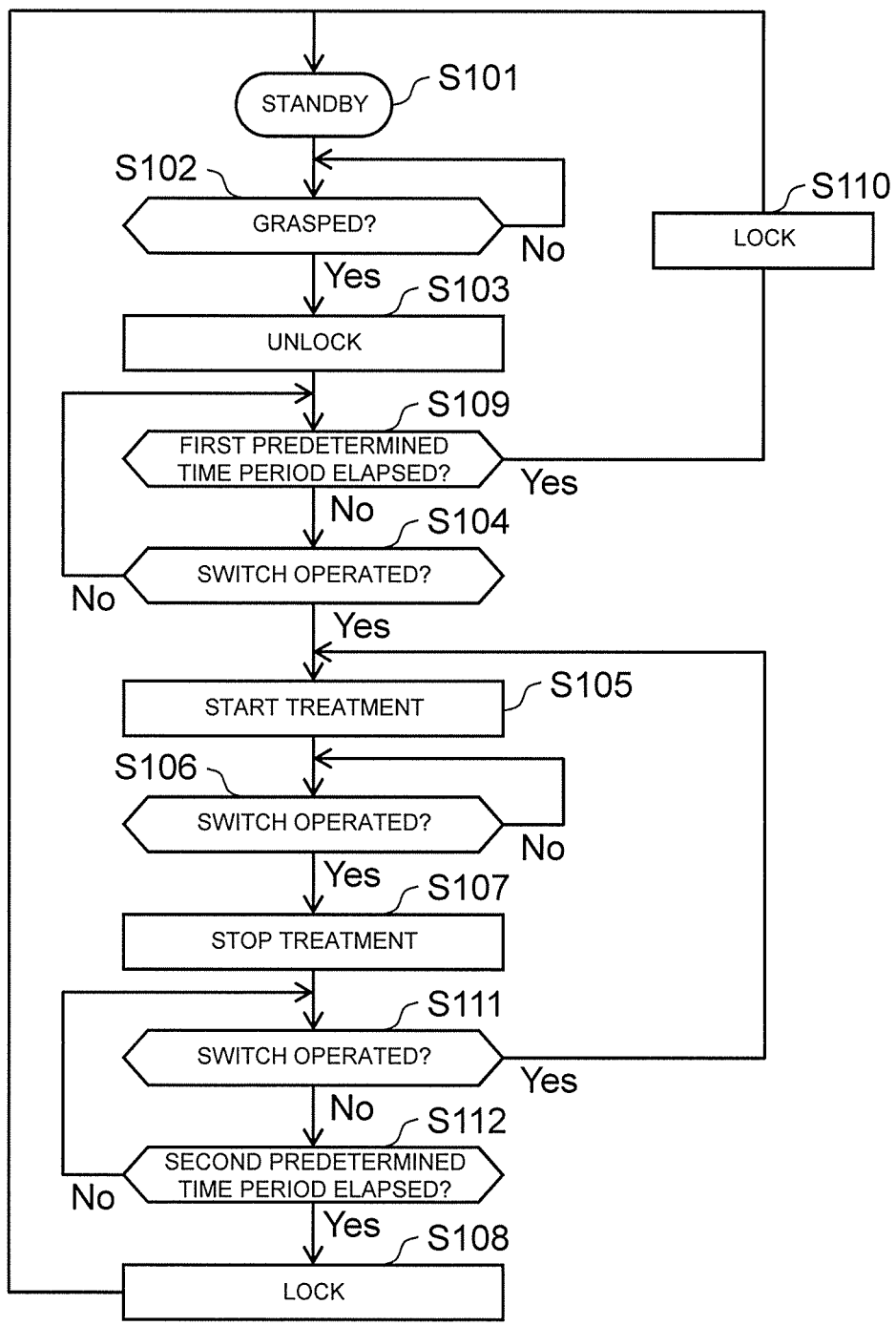
FIG. 8 is a flow chart showing a processing flow of a control device including a grasp detector and a change permission part according to a third exemplary embodiment.
Figure 9:
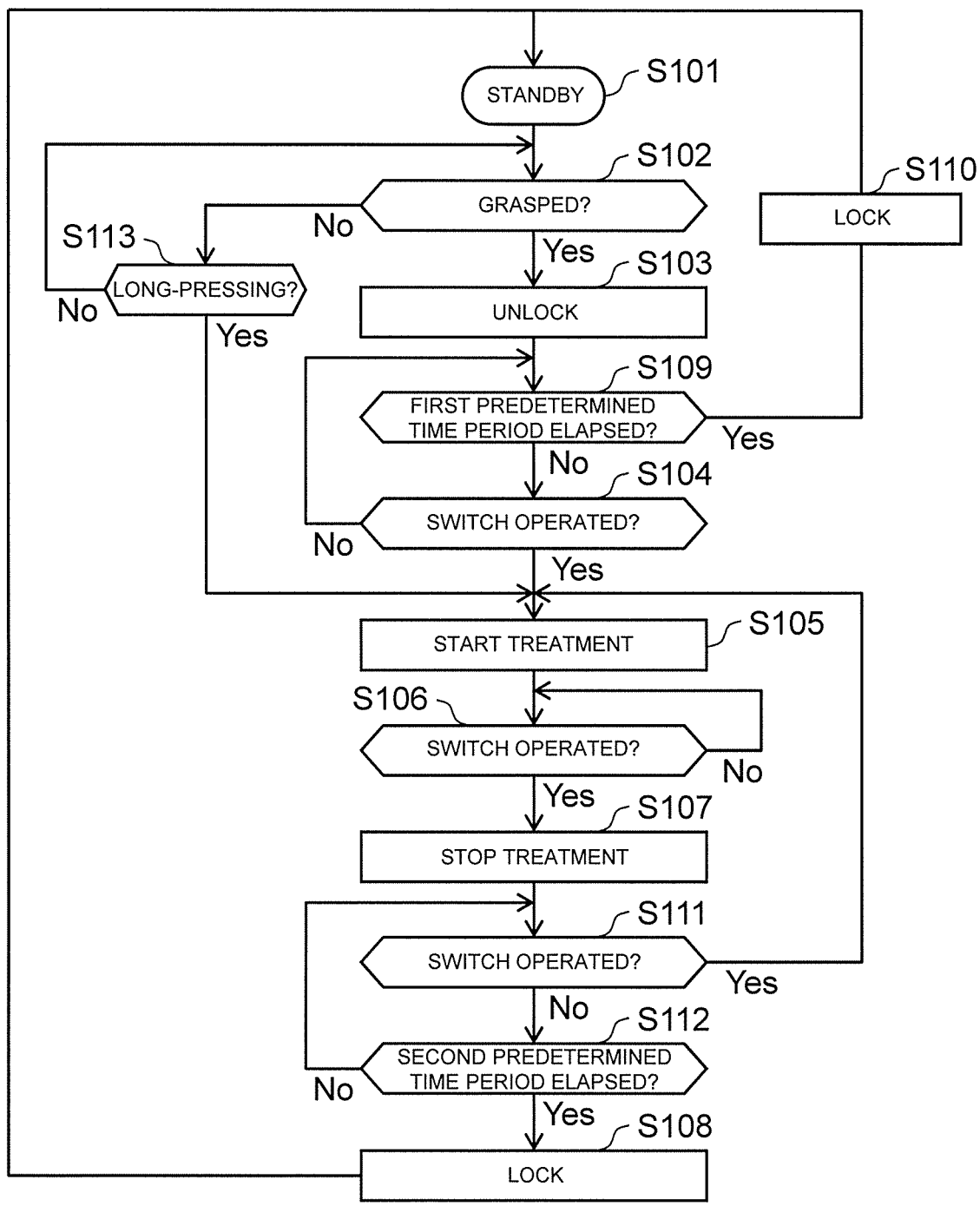
FIG. 9 is a flow chart showing a processing flow of a control device including a grasp detector and a change permission part according to a fourth exemplary embodiment.

FIG. 6 is a flow chart showing a processing flow of a control device including grasp detector 151 and change permission part 152.

Referring to FIG. 6, operation switch 103 is locked in a state in which grip unit 101 is not grasped and handheld personal care device 100 is left without performing any processing. In this step, grasp detector 151 and change permission part 152 are in a standby state (S101).

When a user grasps grip unit 101 of handheld personal care device 100 in this state, grasp detector 151 outputs grasp information indicating that grip unit 101 is grasped (S102: Yes), and change permission part 152 that has received the grasp information outputs to switch processing part 157 the change information indicating permission to accept the signals output from operation determination part 156. Here, operation determination part 156 is a processing part configured to output signals corresponding to a state in which operation switch 103 is operated. Switch processing part 157 is a processing part that determines a next treatment operation, i.e., a processing part that determines to change a treatment operation based on, for example, the change information or the signals output by operation determination part 156. In view of the above, switch processing part 157 that has received the change information is in a state in which switch processing part 157 can determine to change the treatment operation by accepting the signals according to the state of operation switch 103 from operation determination part 156, i.e., operation switch 103 is unlocked (S103).

When operation switch 103 is operated in an unlocked state (S104: Yes), switch processing part 157 outputs signals to treatment controller 158 such that operation unit 102 in a suspension state can perform the treatment operation based on the signals from operation determination part 156. Treatment controller 158 operates operation unit 102 based on the signals (S105).

When operation switch 103 is operated during the treatment operation of operation unit 102 (S106: Yes), treatment controller 158 changes through switch processing part 157 the treatment operation of operation unit 102 from an operation state to a suspension state (S107).

After the treatment operation of operation unit 102 is stopped, operation switch 103 is locked (S108), and maintains the locked state until another grasp of the grip unit is detected.

The configuration according to the present exemplary embodiment allows an operation of operation switch 103 only when a user grasps grip unit 101, and thus an erroneous operation of handheld personal care device 100 can be prevented at the time when handheld personal care device 100 is carried in a bag, even if operation switch 103 is pushed by other objects in the bag.

In addition, handheld personal care device 100 is not mechanically locked unlike conventional ones, thus eliminating the need of complicated operations.

Further, operation switch 103 is automatically locked after use, and thus there is no need to care about a lock operation.

Second Exemplary Embodiment

Another exemplary embodiment is described below. Note that components (parts) having the same actions or functions, and the same shape, mechanism or structure as those in the above first exemplary embodiment are denoted as the same reference symbols and detailed description thereof may be omitted. The following passages mainly describe differences from the first exemplary embodiment and may omit the description of the same features as those of the first exemplary embodiment.

According to the present exemplary embodiment, after a grasp of grip unit 101 is detected (S102: Yes) and operation switch 103 is unlocked (S103), and when a first predetermined time period has elapsed with no operation of operation switch 103 (S109: Yes), operation switch 103 is locked again (S110). Specifically, change permission part 152 includes a clocking part, and the clocking part starts clocking when grasp information is received, and outputs change information to prohibit switch processing part 157 from accepting the signals from operation determination part 156 when no signals are received from operation determination part 156 until the first predetermined time period has elapsed.

With this configuration, since grasp detector 151 determines a grasp based on a change in capacitance of sensor electrode 104, grasp detector 151 outputs grasp information indicating a grasp, for example, even in the case where grip unit 101 is touched by a small animal such as a dog or a cat, or in the case where grip unit 101 gets wet, which causes an increase in capacitance of sensor electrode 104. As a result, change permission part 152 unlocks operation switch 103.

Even in such a case, when operation switch 103 is not operated during the first predetermined time period (S104: No), operation switch 103 is locked again (S110), so that operation switch 103 can be automatically returned to a locked state even when operation switch 103 is unintentionally unlocked.

When another grasp of grip unit 101 is detected in an unlocked state, clocking of a certain period of time may be restarted from the detection of the grasp. Consequently, the first predetermined time period is extended, and thus an unlocked state of operation switch 103 is maintained without returning to a locked state, for example, in the case where a user carries handheld personal care device 100 with grasping grip unit 101 and without operating operation switch 103, even if handheld personal care device 100 is carried for long hours.

Third Exemplary Embodiment

Another exemplary embodiment is described below. Note that components (parts) having the same actions or functions, and the same shape, mechanism or structure as those in the above first and second exemplary embodiments are denoted as the same reference symbols and detailed description thereof may be omitted. The following passages mainly describe differences from the first and second exemplary embodiments and may omit the description of the same features as those of the first and second exemplary embodiments.

According to the present exemplary embodiment, even after a treatment operation of operation unit 102 is stopped (S107), an unlocked state of operation switch 103 is maintained during a second predetermined time period (S112: No), and an operation of operation switch 103 is accepted without any active operation such as re-grasping of grip unit 101 (S111: Yes).

Specifically, a clocking part included in change permission part 152 performs clocking until the second predetermined time period has elapsed after the suspension of the treatment operation of operation unit 102, and when the second predetermined time period has elapsed, change permission part 152 outputs change information to allow switch processing part 157 to accept signals from operation determination part 156.

Consequently, for example, even when a treatment operation is suspended to check unshaved portions after a treatment operation such as shaving has been finished in practical usage, operation unit 102 can be easily operated again when an unshaved portion is found, which improves convenience by eliminating the need of an operation such as re-grasp of grip unit 101.

After the suspension of a treatment operation of operation unit 102 (S107), handheld personal care device 100 may be unlocked by getting wet as described in the second exemplary embodiment in the case where handheld personal care device 100 is put on a wet place such as a washroom. However, a switch operation is not performed during the second predetermined time period after the suspension of the treatment operation (S112: Yes), operation switch 103 is forcibly locked (S108), and thus operation switch 103 can be reliably locked regardless of the place to put handheld personal care device 100.

Fourth Exemplary Embodiment

Another exemplary embodiment is described below. Note that components (parts) having the same actions or functions, and the same shape, mechanism or structure as those in the above first, second, and third exemplary embodiments are denoted as the same reference symbols and detailed description thereof may be omitted. The following passages mainly describe differences from the first, second, and third exemplary embodiments and may omit the description of the same features as those of the first, second, and third exemplary embodiments.

According to the present exemplary embodiment, even when operation switch 103 is not in an unlocked state because grip unit 101 is not grasped (S102: No), long-pressing of operation switch 103 (S113) can start a treatment operation of operation unit 102 (S105).

Specifically, operation determination part 156 includes a clocking part, and when operation switch 103 is continuously operated through a third predetermined time period, for example, when pressing-down of operation switch 103 is continued through the third predetermined time period, change permission part 152 outputs change information to allow switch processing part 157 to accept signals from operation determination part 156.

With this configuration, even when contact failure or the like occurs between sensor electrode 104 and grasp detector 151 for example, a long-pressing of operation switch 103 forces operation switch 103 to be actuated from a locked state, thereby enabling a change in the treatment operation of operation unit 102.

The present disclosure is not limited to the above exemplary embodiments. For example, any combination of the components described herein or another exemplary embodiment implemented without some of the components may be included within the scope of the present disclosure.

Modifications obtained by applying to the above exemplary embodiments various modifications that may be conceived of by those skilled in the art without departing from the spirit of the present disclosure, namely, the recitation in the claims appended hereto, are also included within the scope of the present disclosure.

For example, notification part 159 may be provided to notify that operation switch 103 is locked when operation switch 103 is operated. Notification part 159 may notify a release of a locked state of operation switch 103. A notification manner is not limited, and may include a beeper sound, light-emission such as a light-emitting diode (LED), display on display device 106 such as liquid crystal display, for example.

Display device 106 may be mounted opposite to operation unit 102 across operation switch 103 in a longitudinal direction of handheld personal care device 100. Display device 106 may display an operation state of handheld personal care device 100, remaining battery life, and the like.

Although start and stop of the treatment operation of operation unit 102 are described as a change in the treatment operation in the above exemplary embodiments, a change in the treatment operation is not limited thereto. For example, a change in the treatment operation includes a change in the strength of treatment, a change in treatment mode, and the like.

Although operation unit 102 that treats body hair is exemplified, operation unit 102 is not limited thereto, and may perform any operation that has an effect on a human body and is effective in improving hairdressing and beautification, such as steam injection, generation of charged mists, and transmission of ultrasonic waves.

A rubbery filling sheet (not shown) may be provided between watertight housing 111 and grip unit 101 to fill in a gap. This prevents accumulation of foreign matter between watertight housing 111 and grip unit 101, which avoids an effect on capacitance of sensor electrode 104 arising from adhesion of foreign matter.

The present disclosure is applicable to a handheld personal care device that has hairdressing and beautification effects on a human body, such as a shaver, a body-hair remover, a facial treatment device, a device for warming eyes.

What is claimed is:

1. A handheld personal care device including a grip unit to be grasped by a hand and an operation unit configured to treat a human body, the handheld personal care device comprising:
    an operation switch configured to change a treatment operation of the operation unit;
    a sensor electrode that is embedded in the grip unit, and causes a change in capacitance depending on whether or not the grip unit is grasped; and
    a control device electrically connected to the operation switch and the sensor electrode, and configured to control the treatment operation of the operation unit, wherein the control device includes:
    a grasp detector configured to detect that the grip unit is grasped based on a change in capacitance of the sensor electrode; and
    a change permission part configured to permit the operation switch to change the treatment operation of the operation unit when the change permission part receives, from the grasp detector, grasp information indicating that the grip unit is grasped,
    wherein the change permission part is configured to permit the operation switch to change the treatment operation of the operation unit during a first predetermined time period after receiving the grasp information, wherein the grasp detector includes a charge/discharge circuit, a charge/discharge frequency detection circuit, and a determination circuit, wherein the charge/discharge circuit is configured to charge and discharge the sensor electrode with the predetermined amount of electric charge, the charge/discharge frequency detection circuit configured to count the charge/discharge frequency during the predetermined time period.

2. The handheld personal care device according to claim 1, wherein the change permission part is configured to permit the operation switch to change the treatment operation of the operation unit during a second predetermined time period after an operation of the operation unit is stopped.

3. The handheld personal care device according to claim 1, wherein the change permission part is configured to permit the operation switch to change the treatment operation of the operation unit when the operation switch is continuously operated through a third predetermined time period.

4. The handheld personal care device according to claim 1,
wherein the operation switch is disposed on a first surface of the grip unit,
wherein the sensor electrode includes a first electrode and a second electrode each of which has a plate-shape, and
wherein the first electrode and the second electrode are disposed to meet the first surface, and are disposed to sandwich the operation switch.

5. The handheld personal care device according to claim 1, further comprising a watertight housing inside the grip unit,
wherein the sensor electrode is accommodated in the watertight housing.

6. The handheld personal care device according to claim 1, wherein when the amount of change in the charge/discharge frequency counted exceeds the threshold value as compared to the preceding state, the determination circuit is configured to determine that the grip unit is grasped and to output the grasp information to the change permission part.

7. A handheld personal care device including a grip unit to be grasped by a hand and an operation unit configured to treat a human body, the handheld personal care device comprising:
an operation switch configured to change a treatment operation of the operation unit;
a sensor electrode that is embedded in the grip unit, and causes a change in capacitance depending on whether or not the grip unit is grasped; and
a control device electrically connected to the operation switch and the sensor electrode, and configured to control the treatment operation of the operation unit,
wherein the control device includes:
a grasp detector configured to detect that the grip unit is grasped based on a change in capacitance of the sensor electrode; and
a change permission part configured to permit the operation switch to change the treatment operation of the operation unit when the change permission part receives, from the grasp detector, grasp information indicating that the grip unit is grasped, wherein the change permission part is configured to permit the operation switch to change the treatment operation of the operation unit during a first predetermined time period after receiving the grasp information, wherein the grasp detector is configured to charge and discharge the sensor electrode with a predetermined amount of electric charge, and to count a charge/discharge frequency during a predetermined time period,
wherein when an amount of change in the charge/discharge frequency counted by the grasp detector exceeds a threshold value as compared to a preceding state, the grasp detector determines that the grip unit is grasped and outputs the grasp information.

* * * * *